United States Patent
Kung et al.

(10) Patent No.: US 8,085,014 B2
(45) Date of Patent: Dec. 27, 2011

(54) DUAL POWER SWITCH WITH ACTIVATION CONTROL AND VOLTAGE REGULATOR USING SAME

(75) Inventors: Nien-Hui Kung, HsinChu (TW);
Kwan-Jen Chu, HsinChu (TW);
Chun-Tsung Chen, Taipei (TW);
Tzu-Huan Chiu, Zhubei (TW)

(73) Assignee: Richtek Technology Corporation, Hsin-Chu (TW)

( * ) Notice: Subject to any disclaimer, the term of this patent is extended or adjusted under 35 U.S.C. 154(b) by 446 days.

(21) Appl. No.: 12/378,494

(22) Filed: Feb. 17, 2009

(65) Prior Publication Data
US 2009/0174388 A1  Jul. 9, 2009

(30) Foreign Application Priority Data
Apr. 1, 2008 (TW) ............... 97111871 A

(51) Int. Cl.
*G05F 1/01* (2006.01)
(52) U.S. Cl. ........................ 323/269; 323/274
(58) Field of Classification Search .......... 323/272, 323/282, 284, 285, 269, 274
See application file for complete search history.

(56) References Cited

U.S. PATENT DOCUMENTS

| 5,629,609 | A  | * | 5/1997  | Nguyen et al. ............... 323/269 |
| 5,801,563 | A  | * | 9/1998  | McClure ....................... 327/170 |
| 5,889,427 | A  |   | 3/1999  | Nakajima |
| 6,184,730 | B1 | * | 2/2001  | Kwong et al. ............... 327/112 |
| 6,686,763 | B1 | * | 2/2004  | Yen ............................... 326/30 |
| 6,724,174 | B1 | * | 4/2004  | Esteves et al. ............... 323/224 |
| 7,196,544 | B2 | * | 3/2007  | Loughmiller ................. 326/38 |
| 2004/0222827 | A1 | * | 11/2004 | Degoirat et al. ............. 327/143 |
| 2007/0069770 | A1 | * | 3/2007  | Chen ............................. 327/112 |
| 2007/0171713 | A1 |   | 7/2007  | Hunter et al. |
| 2008/0068869 | A1 |   | 3/2008  | Shimizu |

FOREIGN PATENT DOCUMENTS

| JP | H10-074394 A | 8/1996 |
| JP | 2005-354824 A | 12/2005 |

* cited by examiner

*Primary Examiner* — Jeffrey Sterrett
*Assistant Examiner* — Gary Nash
(74) *Attorney, Agent, or Firm* — Tung & Associates

(57) ABSTRACT

The present invention discloses a dual power switch and a voltage regulator using the dual power switch. The dual power switch comprises a PMOS power switch and an NMOS power switch connected in parallel and operating according to corresponding predetermined conditions, respectively.

26 Claims, 6 Drawing Sheets

DUAL POWER SWITCH WITH ACTIVATION CONTROL AND VOLTAGE REGULATOR USING SAME

BACKGROUND OF THE INVENTION

1. Field of Invention

The present invention relates to a dual power switch and a voltage regulator employing the dual power switch.

2. Description of Related Art

Voltage regulators include linear regulators, buck converters, boost converters, buck-boost converters, inverter converters, fly-back converters, AC-DC converters, and the like. All these regulators must employ one or more power switches. In general, as shown in FIGS. 1 and 2, such power switch is either a PMOS transistor (device 10 in FIG. 1) or an NMOS transistor device 20 in FIG. 2). When the power switch 10 or 20 is ON, current flows from the input terminal Vin to the output terminal Vout (depending on the structure of the voltage regulator, the output terminal Vout in the figures does not necessarily correspond to the output terminal of a regulator which supplies power to a load; in the context of this specification, the terminals Vin and Vout represent both sides of the power switch). The operation of the power switch 10 or 20 is controlled by a control circuit 15 or 25. In some applications, because the NMOS transistor 20 requires a higher gate voltage, a charge pump 23 may be required to pump up the voltage for the control circuit 25.

The above mentioned prior art has the drawback that the resistance of a PMOS power switch in ON state is high, while the power consumption of an NMOS power switch is high. A circuit designer has to choose one between the two, but can not gain both.

In view of the foregoing, it is desired to provide a dual power switch.

SUMMARY OF THE INVENTION

A first objective of the present invention is to provide a dual power switch to overcome the drawback in the prior art.

A second objective of the present invention is to provide a voltage regulator.

In accordance with the foregoing and other objectives, in one aspect, the present invention discloses a dual power switch comprising a PMOS power switch and an NMOS power switch connected in parallel. The PMOS power switch and the NMOS power switch operate according to corresponding predetermined conditions, respectively. For example, they can operate according to a voltage difference between the two sides of the dual power switch, or a current amount flowing through either power switch.

Preferably, the dual power switch further includes a first control circuit and a second control circuit to respectively control the PMOS power switch and the NMOS power switch. The dual power switch may further include a determination circuit to determine whether to enable the first control circuit, the second control circuit, or both.

The present invention also provides a voltage regulator employing the above mentioned dual power switch.

It is to be understood that both the foregoing general description and the following detailed description are provided as examples, for illustration but not for limiting the scope of the invention.

BRIEF DESCRIPTION OF THE DRAWINGS

These and other features, aspects, and advantages of the present invention will become better understood with regard to the following description, appended claims, and accompanying drawings.

DESCRIPTION OF THE PREFERRED EMBODIMENTS

Figure 1:
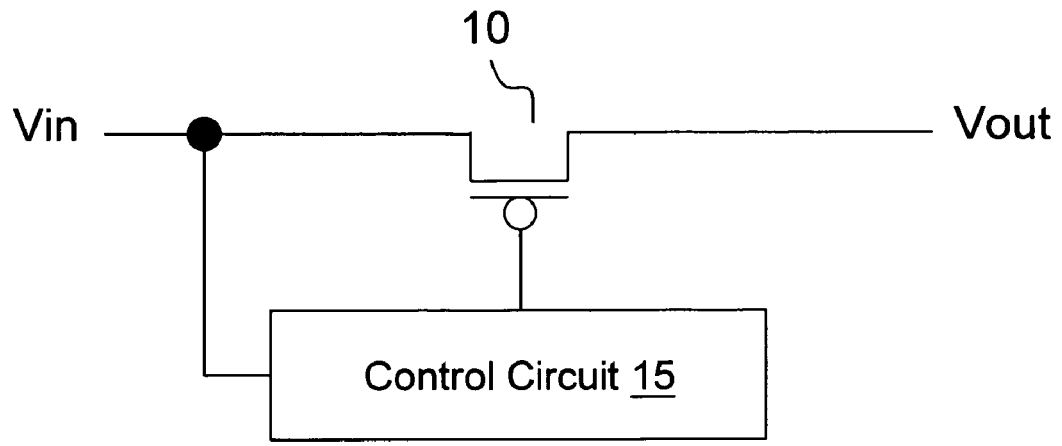
FIGS. 1 and 2 are schematic circuit diagrams showing prior art circuits.
Figure 2:
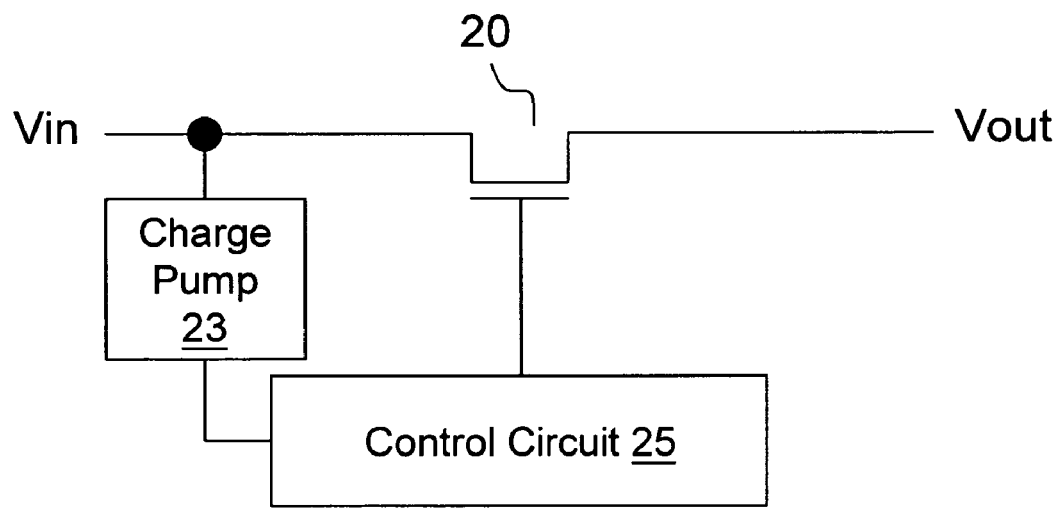
Figure 3:
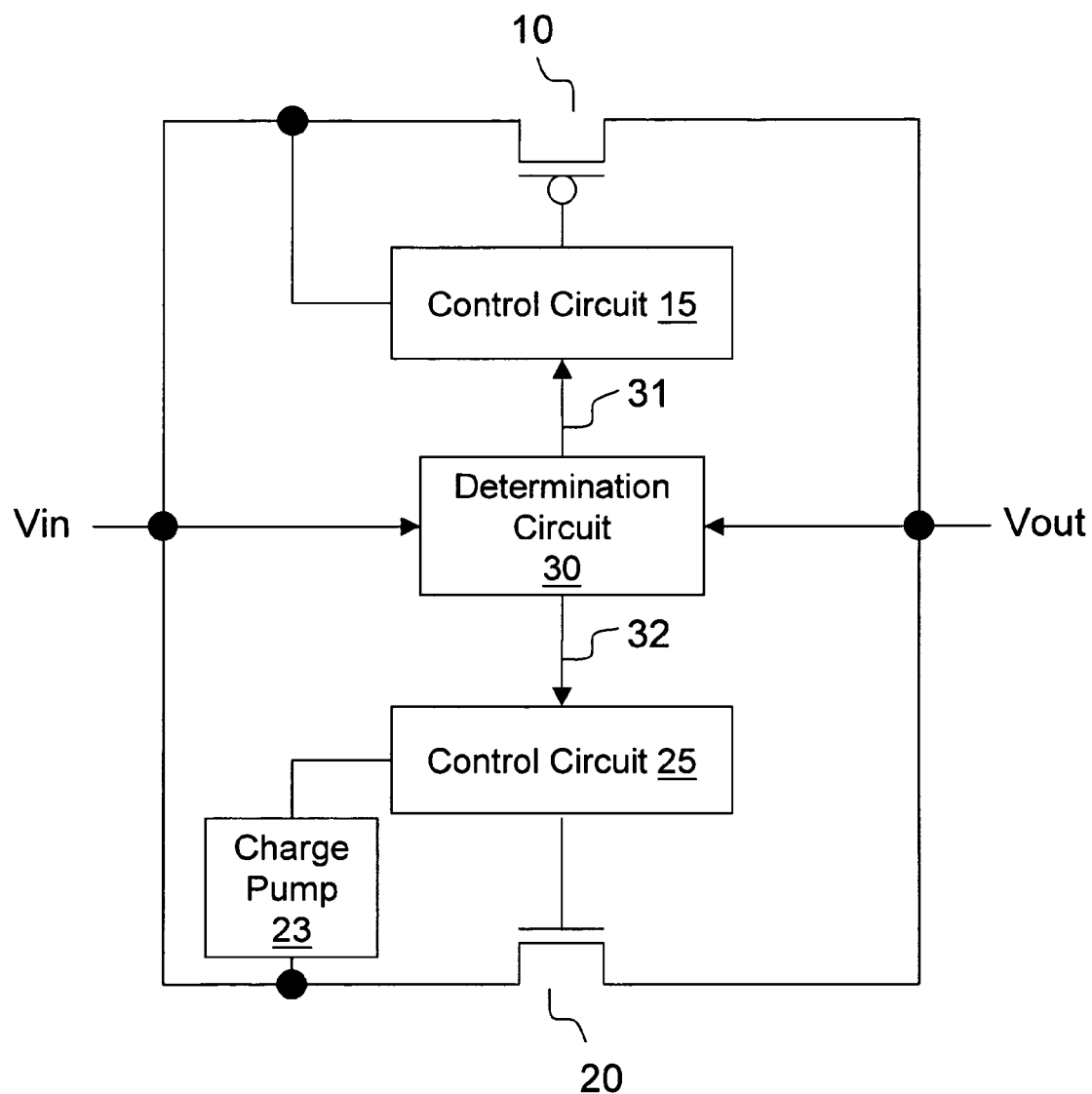
FIG. 3 is a schematic circuit diagram showing an embodiment of the present invention.

Referring to the first embodiment shown in FIG. 3, in the present invention, a PMOS power switch 10 and an NMOS power switch 20 are connected in parallel, and one or both of which are selectively chosen to conduct current between the input terminal Vin and the output terminal Vout. The operation of the power switch 10 is controlled by a control circuit 15, and the operation of the power switch 20 is controlled by a control circuit 25. Moreover, the circuit further includes a determination circuit 30 to determine whether to enable the control circuit 15, the control circuit 25, or both.

Depending on the requirement from a circuit designer or by the application of the circuit, the determination circuit 30 can determine whether to send one or both of enable signals 31 and 32 according to various criteria. And, it is not necessary for the determination circuit 30 to provide two enable signals 31 and 32, controlling the control circuits 15 and 25. For example, in one embodiment, the control circuit 15 is always active, while the determination circuit 30 only provides one enable signal 32 to control the control circuit 25.

As an example, the determination circuit 30 determines whether to enable the control circuit 15 or control circuit 25 or both according to a voltage difference between the two sides of the dual power switch. As a more specific example, let us assume that the control circuit 15 is always active, that the resistance of the PMOS power switch 10 in ON state is 1 Ω, and that that resistance of the NMOS power switch 20 in ON state is 0.1 Ω. Then, it can be arranged such that the enable signal 32 is issued to enable the control circuit 25 when Vin>Vout+0.1V, and the control circuit 25 is disabled when Vin<Vout+0.001V.

Figure 5:
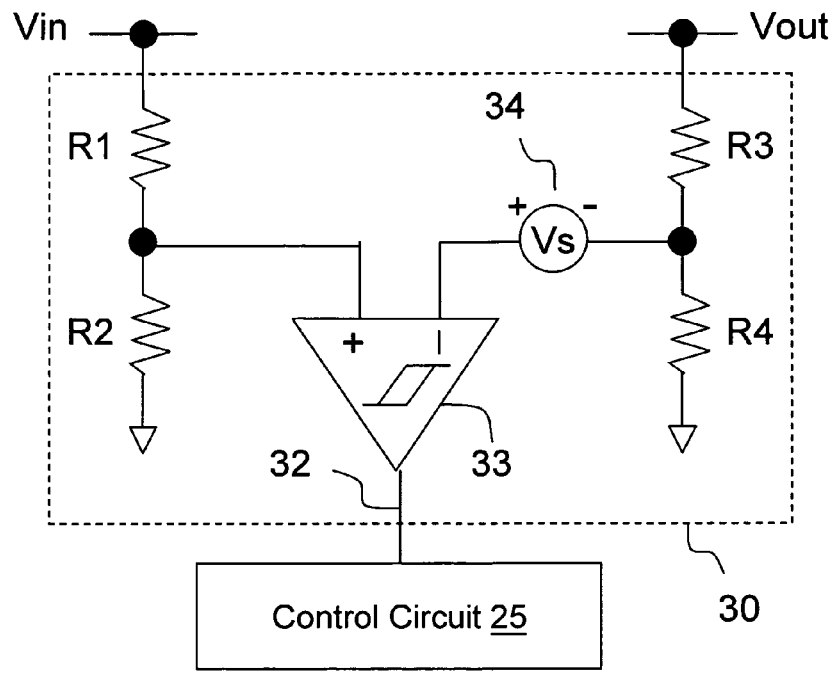
FIG. 5 shows an embodiment of the determination circuit of FIG. 3.

FIG. 5 shows an example to embody the determination circuit 30 for the arrangements described in the previous paragraph. In FIG. 5, resistors R1 and R2 constitute a voltage divider to obtain a dividend voltage from the input terminal Vin, and resistors R3 and R4 constitute another voltage divider to obtain a dividend voltage from the output terminal Vout. The dividend voltage obtained from the output terminal Vout, added by a bias voltage of a voltage source 34, is inputted to the negative input of the comparator 33; the dividend voltage obtained from the input terminal Vin is directly inputted to the positive input of the comparator 33. The comparator 33 generates the enable signal 32 according to the comparison result. The comparator 33 should preferably be a hysteretic comparator because the enable signal 32 is issued and stopped according to different criteria (Vout+0.1V and Vout+0.001V). If the criteria are the same, then the comparator 33 can be a normal comparator. Further, note that the voltage source 34 is shown to represent a voltage difference in a broad sense. The voltage source 34 does not have to be a physical device. For example, if there is an input offset voltage between the two inputs of the comparator 33, which is equal to the bias voltage of the voltage source 34, then the voltage source 34 is not required and the same effect is achieved.

Figure 4:
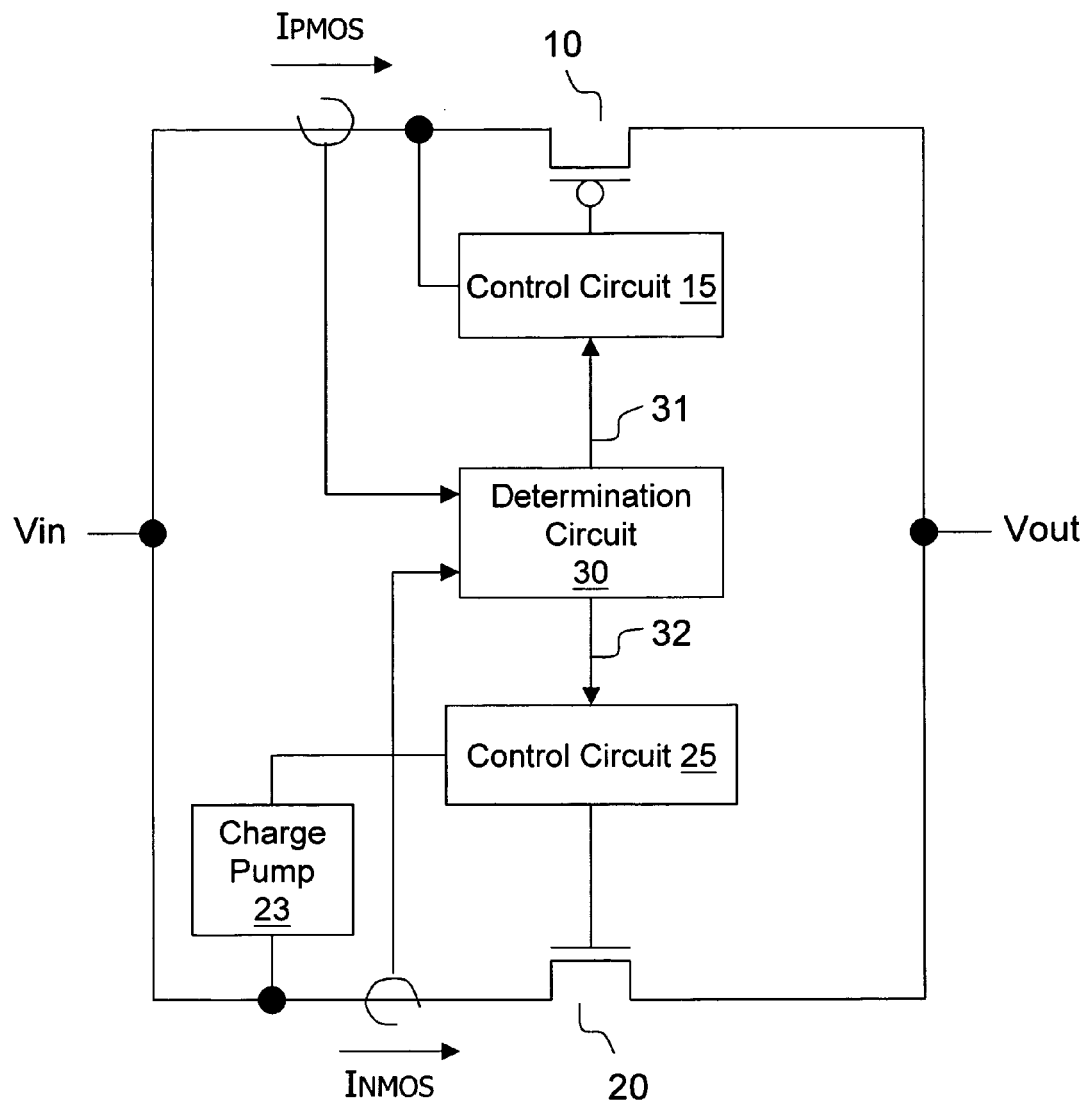
FIG. 4 is a circuit diagram showing another embodiment of the present invention.

In the circuit of FIG. 3, alternatively, the determination circuit 30 can determine whether to enable the control circuit 15 or control circuit 25 or both according to the current flowing through the two power switches. Referring to FIG. 4 which shows another embodiment of the present invention, wherein the current flowing through the PMOS power switch 10 is defined as $I_{PMOS}$ and the current flowing through the NMOS power switch 20 is defined as $I_{NMOS}$, the determination circuit 30 receives information relating to $I_{PMOS}$ and $I_{NMOS}$ and determines whether to issue enable signals according to such information. Again, the determination circuit 30 does not necessarily have to issue two enable signals 31 and 32; it can only issue one of them. Assuming that the control circuit 15 is always active, that the resistance of the PMOS power switch 10 in ON state is 1 Ω, and that that resistance of the NMOS power switch 20 in ON state is 0.1 Ω, then it can be arranged such that the enable signal 32 is issued to enable the control circuit 25 when $I_{PMOS}$>100 mA, and the control circuit 25 is disabled when $I_{NMOS}$<10 mA.

Figure 6:
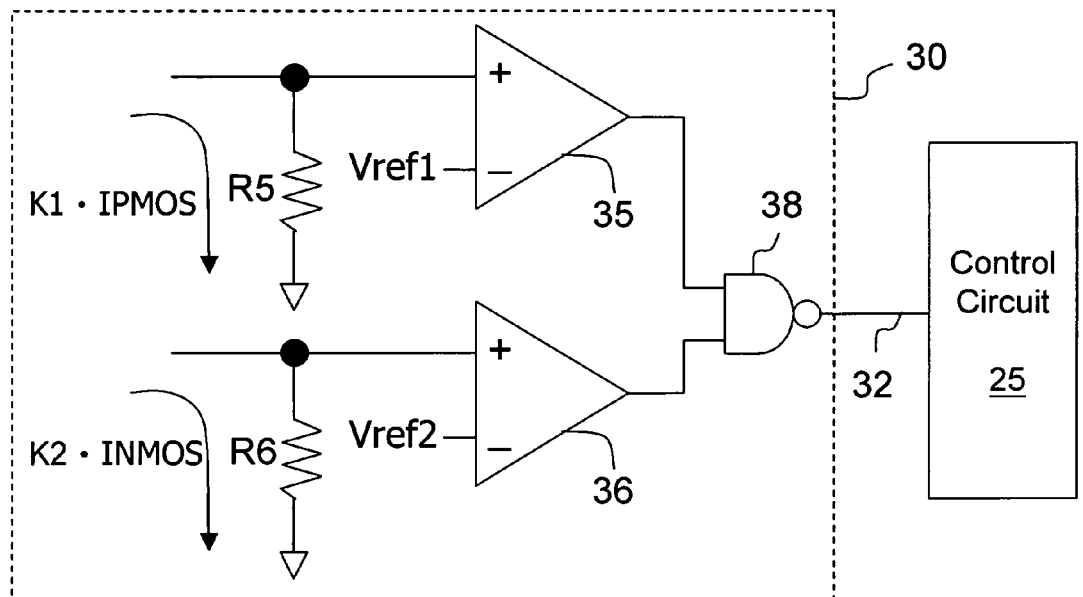
FIG. 6 shows an embodiment of the determination circuit of FIG. 4.

FIG. 6 shows an example to embody the determination circuit 30 for the arrangements described in the previous paragraph. In FIG. 6, the determination circuit 30 receives information relating to $I_{PMOS}$ and $I_{NMOS}$. The information for example are a ratio of $I_{PMOS}$ and a ratio of $I_{NMOS}$ (i.e., $K1 \cdot I_{PMOS}$ and $K2 \cdot I_{NMOS}$). Such information are converted to voltage signals by resistors R5 and R6, and compared with reference voltages Vref1 and Vref2 by comparators 35 and 36, respectively. The comparison in the comparator 35 determines whether $I_{PMOS}$ is larger than 100 mA, and the comparison in the comparator 36 determines whether $I_{NMOS}$ is larger than 10 mA. A logic circuit 38 performs logic operation on the outputs of the comparators 35 and 36: when $I_{PMOS}$ is larger than 100 mA, the logic circuit 38 outputs a high level signal; when $I_{PMOS}$ is not larger than 100 mA and $I_{NMOS}$ is larger than 10 mA, the logic circuit 38 still outputs a high level signal; only when $I_{PMOS}$ is not larger than 100 mA and $I_{NMOS}$ is not larger than 10 mA, the logic circuit 38 outputs a low level signal. The determination circuit 30 generates the enable signal 32 according to the above criteria, and transmits the enable signal 32 to the control circuit 25.

Note that the above details are provided as examples, and anyone skilled in this art can made various modifications based thereon, such as modifying the resistances of the power switches in ON state, the criteria of determination based on the voltage difference or the current amount, etc. The hardware of the determination circuit 30 should certainly be modified accordingly.

In comparison with prior art, the present invention has the advantages that the NMOS power switch 20 can be activated during heavy load condition to provide a lower conduction resistance (and more current supply), while the NMOS power switch 20 (and the charge pump, if there is one) can be disabled during light load condition to reduce power consumption. Thus, the circuit gains the benefits of both the PMOS power switch and the NMOS power switch, and a circuit designer can design a circuit more easily.

Figure 7:
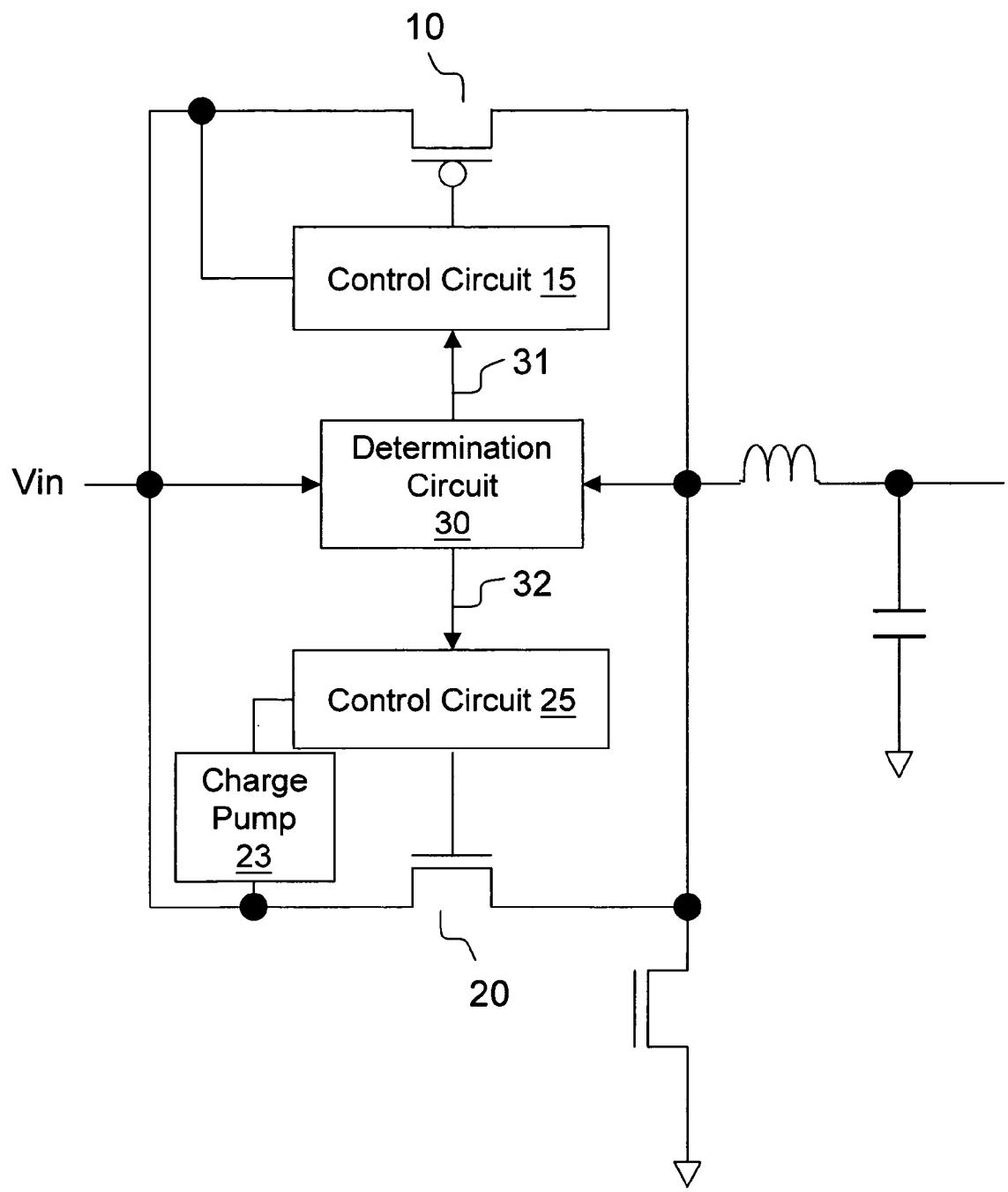
FIGS. 7 and 8 show, by way of example, how the dual power switch of the present invention can be applied to a buck converter.
Figure 8:
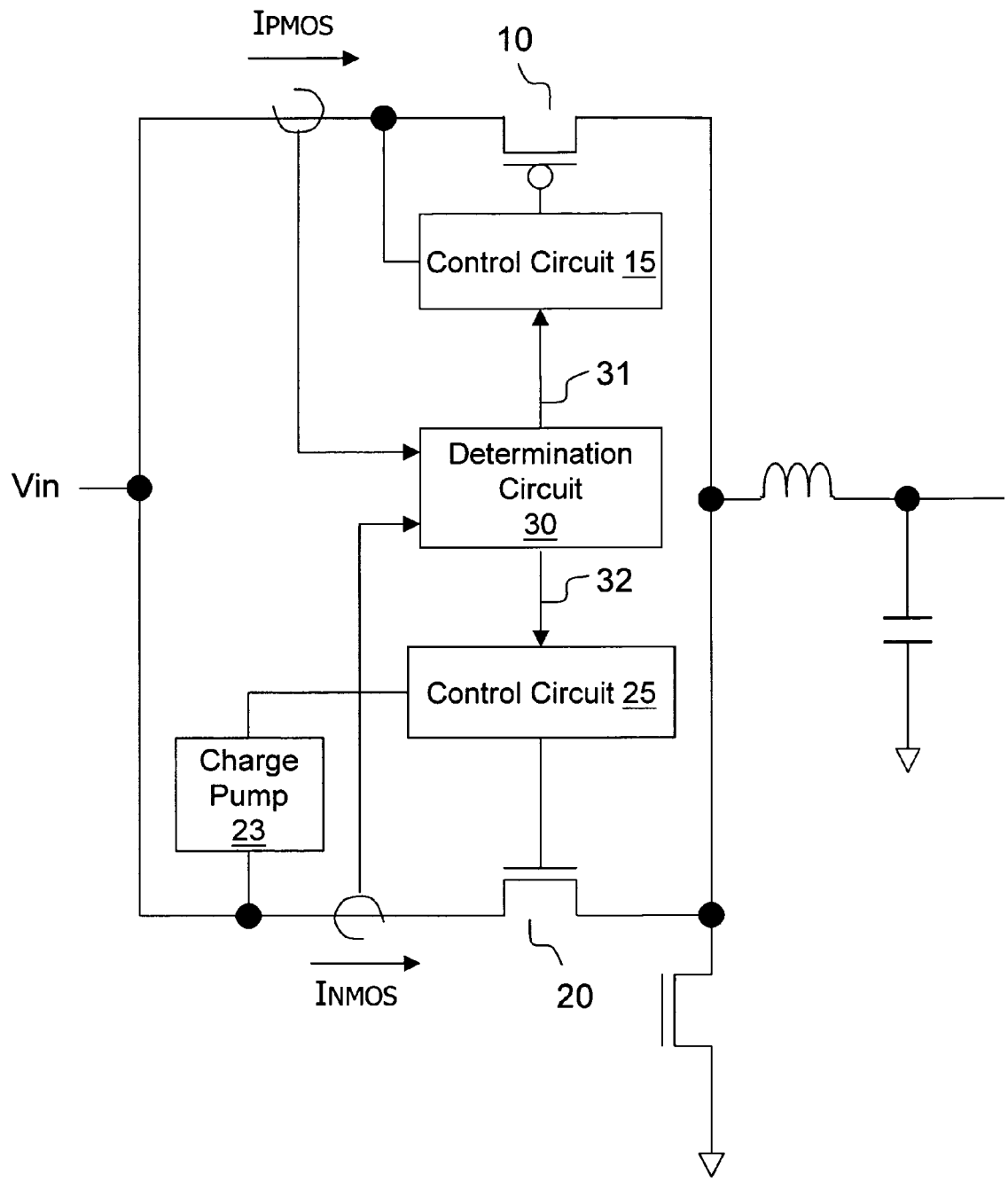

FIGS. 7 and 8 show two examples of how the dual power switch of the present invention can be applied to a buck converter. Under the same spirit, those skilled in this art can apply the dual power switch of the present invention to other kinds of voltage regulators, and the details of such applications are not redundantly repeated here.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the present invention is not limited to the application of voltage regulators; it can be applied to any other kind of circuits. As another example, what is shown in the figures to be one unit block can be combined with another circuit unit, or divided into separate circuits or devices (for example, the control circuit 15 and the control circuit 25 can be integrated as one unit). As a further example, two circuits which are shown in the figures to be in direct connection with each other can be indirectly connected with each other, with devices which do not affect the primary function of the overall circuit interposing between them. In view of the foregoing, the spirit of the present invention should cover all such and other modifications and variations, which should be interpreted to fall within the scope of the following claims and their equivalents.

What is claimed is:

1. A dual power switch comprising a PMOS power switch and an NMOS power switch connected in parallel, wherein the NMOS power switch is activated when a voltage difference between two sides of the dual power switch is larger than a first threshold.

2. The dual power switch of claim 1, wherein the NMOS Power switch stops when the voltage difference between the two sides of the dual power Switch is smaller than a second threshold.

3. The dual power switch of claim 1, wherein the PMOS power switch is always active.

4. The dual power switch of claim 1, further comprising a first control circuit and a second control circuit to respectively control the PMOS power switch and the NMOS power switch.

5. The dual power switch of claim 4, further comprising a determination circuit to determine whether to enable the first control circuit, the second control circuit, or both.

6. The dual power switch of claim 5, wherein the determination circuit includes a comparator which generates a comparison result according to a voltage difference between the two sides of the dual power switch.

7. The dual power switch of claim 6, wherein the comparator is a hysteretic comparator.

8. A voltage regulator comprising a dual power switch which includes a PMOS power switch and an NMOS power switch connected in parallel, wherein the NMOS power switch is activated when a voltage difference between two sides of the dual power-switch is larger than a first threshold.

9. The voltage regulator of claim 8, wherein the NMOS power switch stops functioning when the voltage difference between the two sides of the dual power switch is smaller than a second threshold.

10. The voltage regulator of claim 8, wherein the PMOS power switch is always active.

11. The voltage regulator of claim 8, further comprising a first control circuit and a second control circuit to respectively control the PMOS power switch and the NMOS power switch.

12. The voltage regulator of claim 11, further comprising a determination circuit to determine whether to enable the first control circuit, the second control circuit, or both.

13. The voltage regulator of claim 12, wherein the determination circuit includes a comparator which generates a comparison result according to a voltage difference between the two sides of the dual power switch.

14. The voltage regulator of claim 13, wherein the comparator is a hysteretic comparator.

15. A dual power switch comprising a PMOS power switch and an NMOS power switch connected in parallel, wherein the NMOS power switch is activated when a current flowing through the PMOS power switch is larger than a first threshold.

16. The dual power switch of claim 15, wherein the NMOS power switch stops functioning when the current flowing through the PMOS power switch is not larger than the first threshold and a current flowing through the NMOS power switch is not larger than a second threshold.

17. The dual power switch of claim 15, wherein the PMOS power switch is always active.

18. The dual power switch of claim 15, further comprising a first control circuit and a second control circuit to respectively control the PMOS power switch and the NMOS power switch.

19. The dual power switch of claim 18, further comprising a determination circuit to determine whether to enable the first control circuit, the second control circuit, or both.

20. The dual power switch of claim 19, wherein the determination circuit includes:
   a first comparator comparing a signal representative of current flowing through the PMOS power switch with a first reference voltage;
   a second comparator comparing a signal representative of current flowing through the NMOS power switch with a second reference voltage, and
   a logic circuit performing a logic operation on the outputs of the first and second comparators.

21. A voltage regulator comprising a dual power switch Which includes a PMOS power switch and an NMOS power switch connected in parallel, wherein the NMOS power switch is activated when a current flowing through the PMOS power switch is larger than a first threshold.

22. The voltage regulator of claim 21, wherein the NMOS power switch stops functioning when the current flowing through the PMOS power switch is not larger than the first threshold and a current flowing through the NMOS power switch is not larger than a second threshold.

23. The voltage regulator of claim 21, wherein the PMOS power switch is always active.

24. The voltage regulator of claim 21, further comprising a first control circuit and a second control circuit to respectively control the PMOS power switch and the NMOS power switch.

25. The voltage regulator of claim 24, further comprising a determination circuit to determine whether to enable the first control circuit, the second control circuit, or both.

26. The voltage regulator of claim 25, wherein the determination circuit includes:
   a first comparator comparing a signal representative of current flowing through the PMOS power switch with a first reference voltage;
   a second comparator comparing a signal representative of current flowing through the NMOS power switch with a second reference voltage; and
   a logic circuit performing a logic-operation on the outputs of the first and second comparators.

* * * * *